(12) United States Patent
Yang (10) Patent No.: US 11,889,678 B2
(45) Date of Patent: Jan. 30, 2024

(54) METHOD OF MANUFACTURING BURIED WORD LINE STRUCTURE AND SEMICONDUCTOR MEMORY THEREOF

(71) Applicant: CHANGXIN MEMORY TECHNOLOGIES, INC., Hefei (CN)

(72) Inventor: Jian Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 279 days.

(21) Appl. No.: 17/444,139

(22) Filed: Jul. 30, 2021

(65) Prior Publication Data

US 2021/0358921 A1    Nov. 18, 2021

Related U.S. Application Data

(63) Continuation of application No. PCT/CN2021/086230, filed on Apr. 9, 2021.

(30) Foreign Application Priority Data

May 12, 2020    (CN) .......................... 202010396447.0

(51) Int. Cl.
*H10B 12/00*    (2023.01)
(52) U.S. Cl.
CPC ........... *H10B 12/053* (2023.02); *H10B 12/34* (2023.02)
(58) Field of Classification Search
None
See application file for complete search history.

(56) References Cited

U.S. PATENT DOCUMENTS

| | | | |
|---|---|---|---|
| 7,875,560 B2 | 1/2011 | Zundel | |
| 8,580,678 B2 | 11/2013 | Hwang | |
| 8,987,111 B2 * | 3/2015 | Choi | ................... H01L 21/3086 |
| | | | 438/420 |
| 9,236,501 B2 | 1/2016 | Lim | |
| 9,379,197 B1 | 6/2016 | Wu | |
| 9,825,146 B2 | 11/2017 | Lim | |
| 10,290,736 B2 | 5/2019 | Chen et al. | |
| 2003/0194847 A1 | 10/2003 | Chen | |
| 2005/0142798 A1 | 6/2005 | Jung | |

(Continued)

FOREIGN PATENT DOCUMENTS

| | | |
|---|---|---|
| CN | 103545383 A | 1/2014 |
| CN | 102810480 B | 1/2016 |

(Continued)

OTHER PUBLICATIONS

International Search Report in the international application No. PCT/CN2021/086230, dated Jun. 24, 2021.

(Continued)

*Primary Examiner* — Hsien Ming Lee
(74) *Attorney, Agent, or Firm* — Syncoda LLC; Feng Ma (57) ABSTRACT

A method of manufacturing a buried word line structure includes: providing a semiconductor substrate; injecting target ions into the semiconductor substrate to form an injected region in the semiconductor substrate; annealing the semiconductor substrate including the injected region to convert the injected region into an insulation region; forming a word line trench in the insulation region; and filling the word line trench with a word line metal to form a buried word line structure.

19 Claims, 6 Drawing Sheets

(56) References Cited

U.S. PATENT DOCUMENTS

| | | |
|---|---|---|
| 2010/0219473 A1 | 9/2010 | Lee |
| 2012/0108057 A1 | 5/2012 | Hwang |
| 2014/0021521 A1 | 1/2014 | Lim |
| 2014/0151805 A1 | 6/2014 | Lee |
| 2014/0361354 A1 | 12/2014 | Ting et al. |
| 2016/0087072 A1 | 3/2016 | Lim |
| 2017/0207224 A1 | 7/2017 | Ting et al. |
| 2017/0229467 A1 | 8/2017 | Ting et al. |
| 2018/0190661 A1 | 7/2018 | Wang et al. |
| 2018/0212055 A1 | 7/2018 | Chen et al. |
| 2020/0006349 A1 | 1/2020 | Ting et al. |

FOREIGN PATENT DOCUMENTS

| | | |
|---|---|---|
| CN | 108346665 A | 7/2018 |
| KR | 20140046526 A | 4/2014 |

OTHER PUBLICATIONS

Supplementary European Search Report in the European application No. 21802580.7, dated Jul. 28, 2022.

\* cited by examiner

METHOD OF MANUFACTURING BURIED WORD LINE STRUCTURE AND SEMICONDUCTOR MEMORY THEREOF

CROSS-REFERENCE TO RELATED APPLICATIONS

This application is a continuation of International Application No. PCT/CN2021/086230 filed on Apr. 9, 2021, which claims priority to Chinese Patent Application No. 202010396447.0 filed on May 12, 2020. The disclosures of these applications are hereby incorporated by reference in their entirety.

BACKGROUND

A dynamic random-access memory (DRAM) is a common system internal memory. Each memory cell includes one transistor and one corresponding capacitor. The quantity of charges stored in a capacitor is configured to represent 0 and 1. In order to avoid data errors caused by insufficient charges, the capacitor needs to be refreshed periodically.

SUMMARY

The disclosure relates generally to the technical field of semiconductors, and more specifically relates to a method of manufacturing a buried word line structure and a semiconductor memory thereof.

The disclosure is directed to overcome at least one deficiencies existed in the related techniques to provide a method of manufacturing a buried word line structure and a semiconductor memory thereof, which can avoid damage to a semiconductor substrate and can simplify the manufacturing process of the buried word line structure.

According to one aspect of the disclosure, a method of manufacturing a buried word line structure is provided. The method includes providing a semiconductor substrate; injecting target ions into the semiconductor substrate to form an injected region in the semiconductor substrate; annealing the semiconductor substrate including the injected region to convert the injected region into an insulation region; forming a word line trench in the insulation region; and filling the word line trench with a word line metal to form the buried word line structure.

According one aspect of the disclosure, a semiconductor memory is provided. The semiconductor memory includes: using the buried word line structure manufactured by the method of any one of the above embodiments.

It should be understood that the above general description and the following detailed description are exemplary and explanatory only, and are not intended to limit the disclosure.

BRIEF DESCRIPTION OF THE DRAWINGS

The drawings herein are incorporated in and constitute a part of the disclosure, illustrating examples consistent with the disclosure, and explaining the principles of the disclosure together with the specification. Apparently, the drawings in the following description are only some examples of the disclosure. Those of ordinary skill in the art can further obtain other drawings based on these drawings without creative work.

DETAILED DESCRIPTION

Exemplary implementation modes will be now described more comprehensively with reference to the accompanying drawings. However, the exemplary implementation modes can be embodied in a variety of forms and should not be construed as being limited to the examples set forth herein. Rather, these implementation modes are provided to make the disclosure more comprehensive and complete, and fully convey the concept of the exemplary implementation modes to those skilled in the art.

In addition, the features, structures or characteristics described herein may be combined in one or more embodiments in any proper manner. In the following description, many specific details are provided to give a sufficient understanding of the embodiments of the disclosure. However, those skilled in the art will realize that the technical solutions of the disclosure can be practiced without one or more of the specific details, or other methods, components, devices, steps, etc. can be used. In other cases, well-known methods, devices, implementations or operations are not shown or described in detail in order to avoid obscuring aspects of the disclosure.

The flowchart shown in the drawings is only an exemplary explanation, and does not necessarily include all contents and operations/steps, nor does it have to be executed in the described order. For example, some operations/steps can be divided, and some operations/steps can be combined or partially combined, so the actual execution order may be changed according to actual conditions.

The terms "a/an", "one", "the", "said" and "at least one" are used to indicate the presence of one or more elements/components/etc.; the terms "include" and "have" are used to indicate open-ended inclusion and mean that in addition to the listed elements/components/etc., there may be other elements/components/etc.; and the terms "first" and "second" are only used as signs, not to limit the quantity of its objects.

According to the following description, the advantages and features of the disclosure will be clearer. It should be noted that the drawings are in a very simplified form and all take imprecise proportions, which are only used to conveniently and clearly assist in explaining the purposes of the examples of the disclosure. It should be understood that, in the following description, references to "on" and "below" each layer may be made based on the drawings. However, it should be understood that the spatially relative terms are intended to encompass different orientations in use or operation other than the orientation described in the drawings. For example, if the device in the drawing is inverted or positioned in different ways (such as rotated), the exemplary term "on" may also include "under" and other orientation relationships. When a layer, a region, a pattern or a structure is "on" a substrate, a layer, a region and/or a pattern, it can be directly on another layer or substrate, and/or an inserted layer may also be present. Similarly, when a layer is referred to as being "under" another layer, it can be directly under the layer, and/or one or more inserted layers may also be present.

In order to improve the integration degree of the DRAM to speed up the operation of each memory cell and to deal with a strong market need for DRAMs from personal computer (PC), smart phone, tablet and other products, a DRAM of a buried word line structure may be developed to meet the above need.

In the DRAM of the buried word line structure, the buried word line structure is formed in a semiconductor substrate and intersects an active region in the semiconductor substrate, so that part of word lines can be configured as the gates of transistors of the memory cells. The source and drain regions of the transistors are formed in the substrate on both sides of the gates.

However, in a method of manufacturing the buried word line in the DRAM, a trench is formed by dry etching, which causes a great damage to a silicon surface of the semiconductor substrate, thereby causing leakage current in the DRAM.

Figure 1:
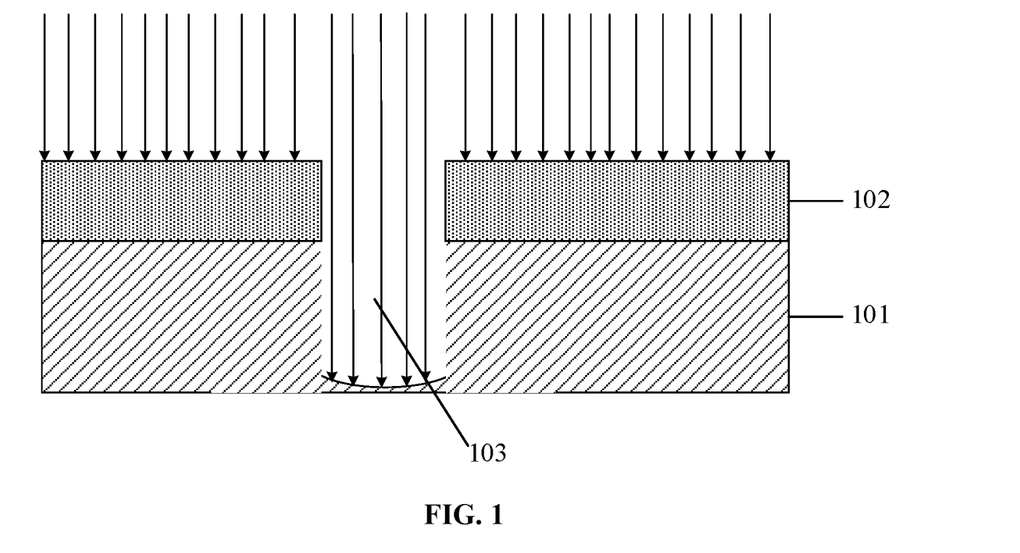
FIG. 1 illustrate a first schematic diagram of a method of manufacturing a buried word line structure.
Figure 2:
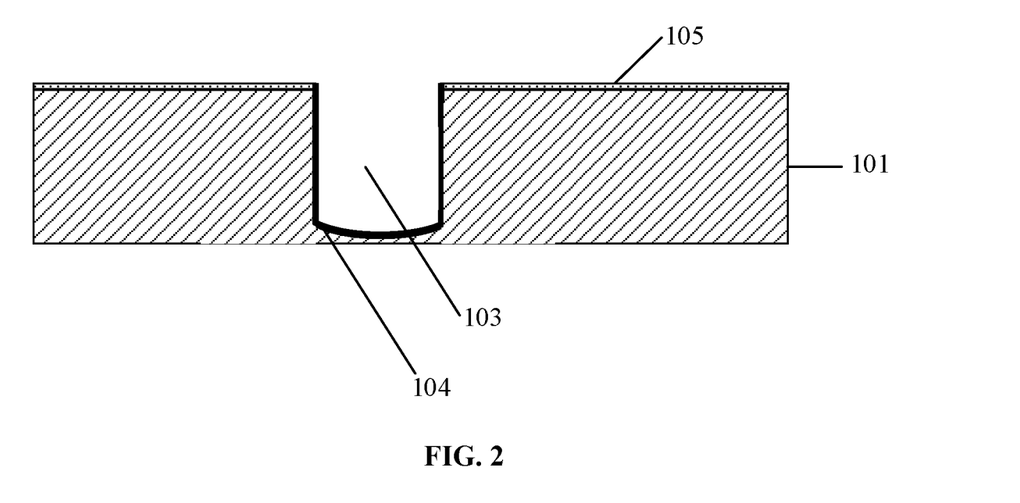
FIG. 2 illustrates a second schematic diagram of a method of manufacturing a buried word line structure.
Figure 3:
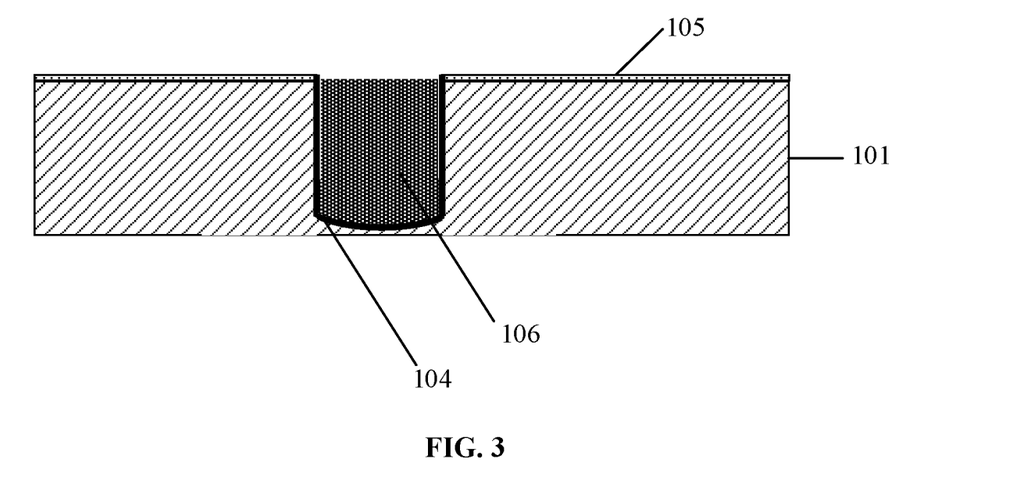
FIG. 3 illustrates a third schematic diagram of a method of manufacturing a buried word line structure.

FIG. 1 to FIG. 3 illustrate schematic diagrams of a method of manufacturing a buried word line structure.

A buried word line in a dynamic random access memory (DRAM) is a deeply buried gate. As shown in FIG. 1, a mask layer 102 is firstly formed on an upper surface of a semiconductor substrate 101, and then the semiconductor substrate 101 is trenched by means of dry etching to form a word line trench 103. As shown in FIG. 2, the mask layer 102 is then removed, and an oxide layer 104 grows on a side wall and a bottom wall of the word line trench 103. As shown in FIG. 3, the word line trench 103 is filled with a word line metal 106 to serve as a gate of a transistor in the DRAM.

However, in the above method, when the semiconductor substrate is trenched by means of dry etching in FIG. 1, a silicon surface of the semiconductor substrate will be greatly lost, thereby causing generation of leakage current.

Figure 4:
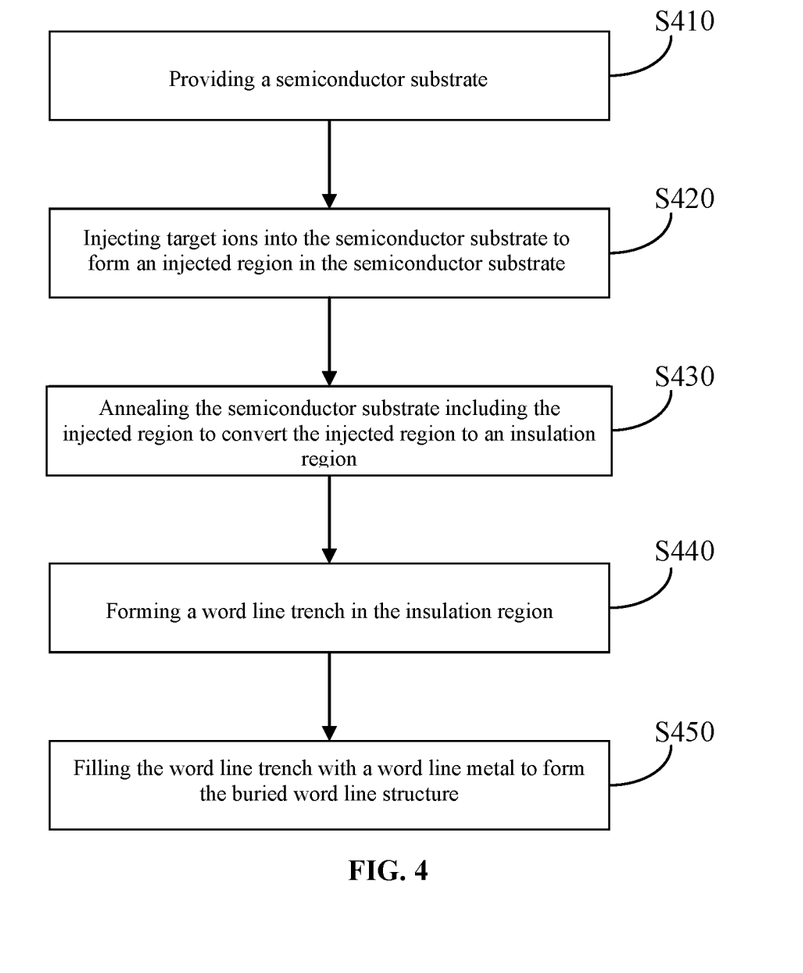
FIG. 4 schematically illustrates a flowchart of a method of manufacturing a buried word line structure according to an example of the disclosure.

The method provided by the examples of the disclosure can solve the technical problems in the above method. FIG. 4 schematically illustrates a flowchart of a method of manufacturing a buried word line structure according to an example of the disclosure.

As shown in FIG. 4, the method provided by the example of the disclosure may include the following steps.

In S410, a semiconductor substrate is provided.

Figure 5:
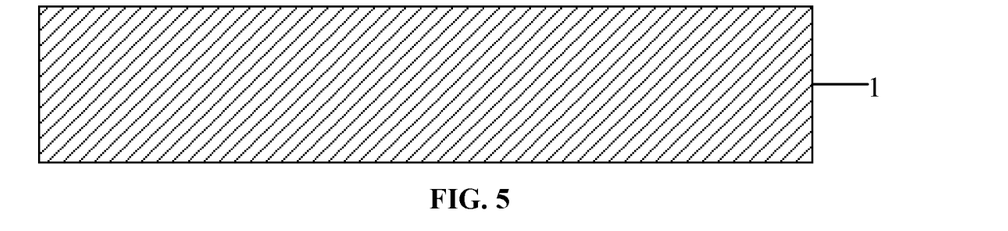
FIG. 5 illustrates a first schematic diagram of a method of manufacturing a buried word line structure according to an example of the disclosure.

For example, as shown in FIG. 5, the semiconductor substrate 1 is provided.

In the examples of the disclosure, the semiconductor substrate may be, but not limited to, any one of semiconductor substrate materials such as Si, Ge, SiGe, SiC, SiCGe, and silicon-on-insulator (SOI). In the following examples, the semiconductor substrate that contains the Si material is exemplified.

In S420, target ions are injected into the semiconductor substrate to form an injected region in the semiconductor substrate.

In an exemplary example, the method further includes that before target ions are injected into the semiconductor substrate, a first mask layer is formed on an upper surface of the semiconductor substrate, which includes a first opening configured to partially expose the upper surface of the semiconductor substrate.

In the example of the disclosure, one layer of photoresist may be spin-coated on the upper surface of the semiconductor substrate, and then exposure and development processes are performed with a mask plate; and the photoresist, corresponding to the injected region, on the semiconductor substrate is removed to form the first mask layer with the first opening. A material of the first mask layer may be, for example, silicon nitride, but is not limited to this. A material of the first mask layer may also be any one or a combination of two or more selected from oxides of undoped-silicate glass (USG), boro-phospho-silicate glass (BPSG), boro-silicate glass (BSG), a phospho-silicate glass (PSG), tetraethoxysilane (TEOS).

Specifically, a forming method of the first mask layer may include chemical vapor deposition (CVD), physical vapor deposition (PVD), atomic layer deposition (ALD), high-density plasma CVD (HDPCVD), metal-organic CVD (MOCVD), plasma enhanced CVD (PECVD) or other suitable deposition processes. Film layers such as a second mask layer and a gate dielectric layer described below may also be manufactured by using a similar deposition method, so that the deposition methods of the various film layers will be no longer introduced in the following descriptions of the method of manufacturing the buried word line structure.

Figure 6:
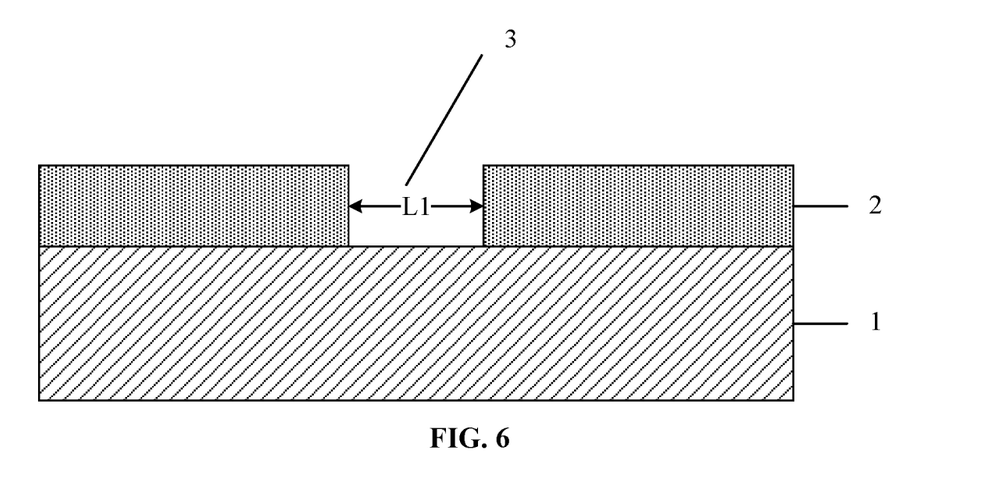
FIG. 6 illustrate a second schematic diagram of a method of manufacturing a buried word line structure according to an example of the disclosure.

For example, as shown in FIG. 6, a first mask layer 2 is formed on the upper surface of the semiconductor substrate 1. The first mask layer 2 may include a first opening 3. The upper surface of the semiconductor substrate 1 may be partially exposed through the first opening 3 to subsequently form the injected region.

The size and the position of the first opening 3 are related to specific requirements of the buried word line structure to be manufactured, which are not limited in the disclosure. Here, assuming that the size of the first opening 3 is L1, a specific value of L1 may be set according to the specific requirements of the buried word line structure to be manufactured. Optionally, the value of L1 may be 20 nm to 80 nm, which is not limited thereto in the disclosure.

Figure 7:
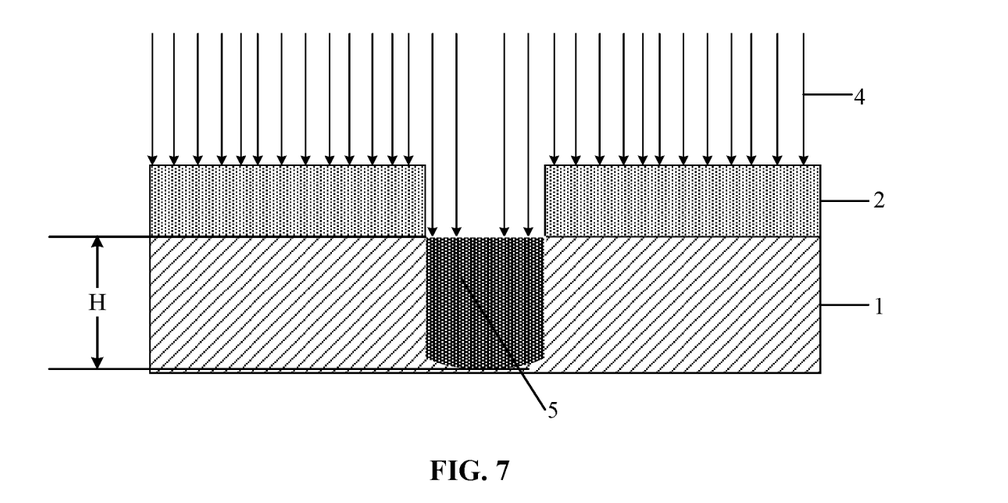
FIG. 7 illustrates a third schematic diagram of a method of manufacturing a buried word line structure according to an example of the disclosure.

For example, as shown in FIG. 7, the target ions 4 are injected into the semiconductor substrate 1, so as to form the injected region 5 on the part, corresponding to the first opening 3, in the semiconductor substrate 1. The injected region here refers to a region injected with the target ions.

In the example of the disclosure, during injection of the target ions 4, a continuous or pulse ion injection process may be employed, which is not limited in the disclosure.

In exemplary examples, the target ions include oxygen-containing ions.

In exemplary examples, a concentration of the injected target ions may be between 1E16 and 5E16 cm-2.

In exemplary examples, the target ions may be injected with energy of 50 to 1000 KeV.

In exemplary examples, an injection depth H of the target ions may be 30 nm to 300 nm. Optionally, the injection depth of the target ions may be 60 nm, 100 nm, 160 nm, 200 nm, and 260 nm. However, the disclosure is not limited to this. Parameters such as the type, the concentration and the energy of the injected target ions may be adjusted according to an actual need to change the injection depth of the target ions.

In S430, the semiconductor substrate including the injected region is annealed to convert the injected region into an insulation region.

In exemplary examples of the disclosure, an annealing temperature is between 850° C. and 1300° C., and an annealing time is between 5 seconds and 60 seconds. However, the disclosure is not limited to this. The annealing parameters may be adjusted according to a specific application scenario.

Figure 8:
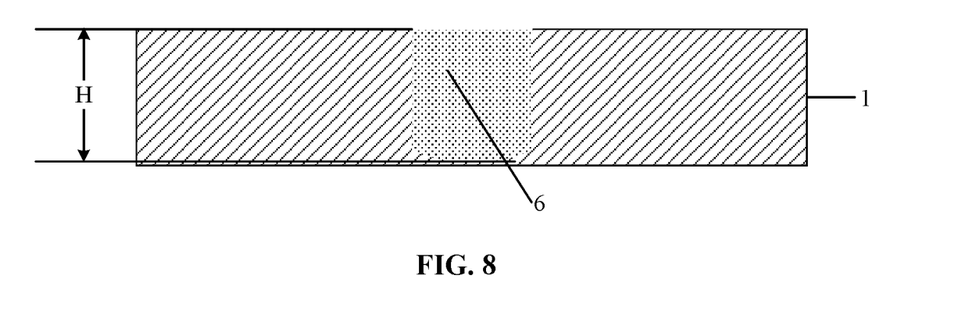
FIG. 8 illustrates a fourth schematic diagram of a method of manufacturing a buried word line structure according to an example of the disclosure.

In the example of the disclosure, as shown in FIG. 8, the first mask layer 2 on the upper surface of the semiconductor substrate 1 can be removed before annealing. After that, the semiconductor substrate 1 is subjected to a high-temperature annealing to convert the injected region 5 in FIG. 7 to the insulation region 6 in FIG. 8.

In S440, a word line trench is formed in the insulation region.

Figure 9:
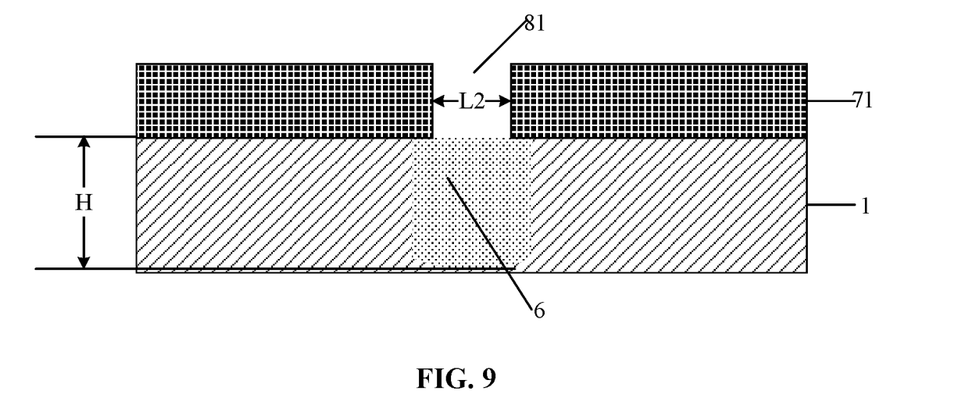
FIG. 9 illustrates a fifth schematic diagram of a method of manufacturing a buried word line structure according to an example of the disclosure.
Figure 13:
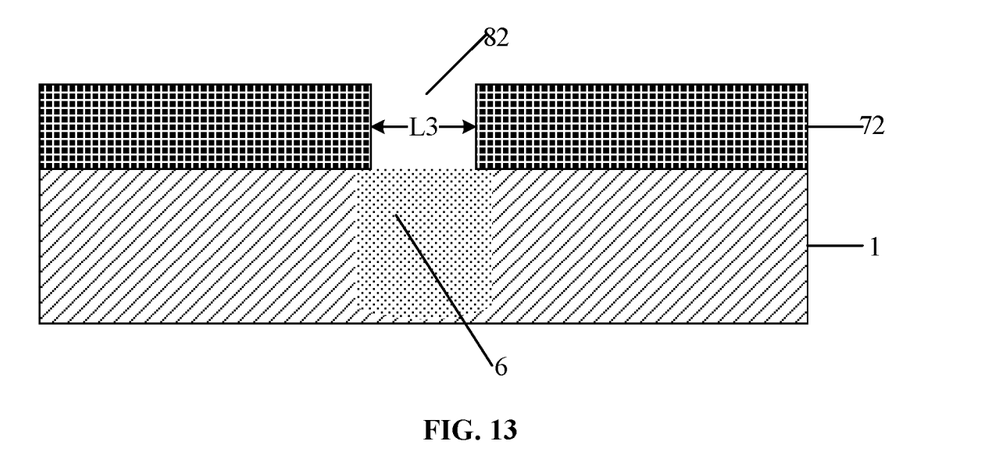
FIG. 13 illustrate a first schematic diagram of another method of manufacturing a buried word line structure according to an example of the disclosure.

In exemplary examples, the method may further include the following operation before the word line trench is formed in the insulation region. A second mask layer (such as a second mask layer 71 in FIG. 9 or a second mask layer 72 in FIG. 13) is formed on the upper surface of the semiconductor substrate. The second mask layer includes a second opening (such as a second opening 81 in FIG. 9 or a second opening 82 in FIG. 13) configured to partially expose the upper surface of the insulation region. Here, it is assumed that the size of the second opening 81 is L2, the size of the second opening 82 is L3, and the second opening is smaller than the first opening (L2 in FIG. 9 is less than L1, or L3 in FIG. 13 is less than L1). A specific value of L2 may be set according to the specific requirements of the buried word line structure to be manufactured. Optionally, the value of L2 or L3 may be 10 nm to 70 nm. The disclosure is not limited thereto.

The method for etching and forming the word line trench may be a wet etching process and/or a dry etching process. In the wet etching process, etching liquid used may be acidic etching liquid or alkaline etching liquid. The word line trench may also be formed by repeating an etching process for several times. It can be understood that either the dry etching process or the wet etching process should have adjustable etching parameters, such as an etching liquid (or an etching gas) used, an etching temperature, a concentration of the etching liquid (or the etching gas), an etching pressure, power of a power supply, a flow velocity of the etching liquid (or the etching gas), and other suitable parameters, so as to obtain the size and the shape of the word line trench described in the examples of the disclosure.

In the examples of the disclosure, the second mask layer with a second opening pattern may be used as a mask to downwardly etch the semiconductor substrate by an etching method of, for example, plasma dry etching, thereby forming the word line trench in the semiconductor substrate.

In S450, the word line trench is filled with a word line metal to form the buried word line structure.

In the examples of the disclosure, a material of the word line metal may be selected from one or more of a metal (such as tungsten, tantalum, titanium, molybdenum, aluminum, hafnium, and ruthenium), a metal silicide (such as titanium silicide, cobalt silicide, nickel silicide, and tantalum silicide), and conductive polycrystalline silicon.

In the examples of the disclosure, the word line trench is formed in the semiconductor substrate, and a word line is formed in the word line trench. The word line extends in a direction parallel to the surface of the semiconductor substrate. When used as a semiconductor memory, the semiconductor substrate can also have an active region (not shown) and an isolation structure configured to define the range of the active region.

In the examples of the disclosure, the sizes and the shapes of the formed insulation region and word line trench can be controlled by adjustment of the process parameters in the manufacturing process, so that the formed insulation region can be used as an oxide layer and a gate dielectric layer on a side wall and a bottom wall of the word line metal that fills in the word line trench.

The above S440 and S450 are exemplified below respectively by referring to FIG. 9 to FIG. 12 and FIG. 13 to FIG. 16.

According to the method of manufacturing the buried word line structure provided by the examples of the disclosure, on one hand, in the process of manufacturing the buried word line structure, a word line trench is formed by means of ion injection, i.e., the target ions are injected into a semiconductor substrate such as silicon, and the target ions may include high-concentration oxygen ions, thereby forming the injected region in the semiconductor substrate; the semiconductor substrate including the injected region is then annealed at a high temperature to activate the target ions in the injected region to convert the injected region to an insulation region, and the word line trench is formed in the insulation region, so that damage to the semiconductor substrate can be avoided; and on the other hand, the word line trench can be directly filled with the word line metal, i.e., the insulation region is used as an oxide layer; such oxide layer required by the buried word line can be formed without an opening, or a gate dielectric layer need not be formed, thereby simplifying the manufacturing process of the buried word line structure. Moreover, when the buried word line structure is applied to manufacturing a semiconductor memory, generation of leakage current in the semiconductor memory can be avoided, so that the performance of the semiconductor memory can be improved.

FIG. 5 to FIG. 12 schematically illustrate diagrams of a method of manufacturing a buried word line structure according to an example of the disclosure.

The descriptions of FIG. 5 to FIG. 8 may refer to the above examples. As shown in FIG. 9, a second mask layer 71 is formed on the upper surface of the semiconductor substrate 1. The second mask layer 71 has a second opening 81. The size of the second opening 81 is assumed to be L2, and L2 is less than the size L1 of the first opening 3 in the above examples, so that the upper surface of the insulation region 6 is partially exposed through the second opening 81.

Figure 10:
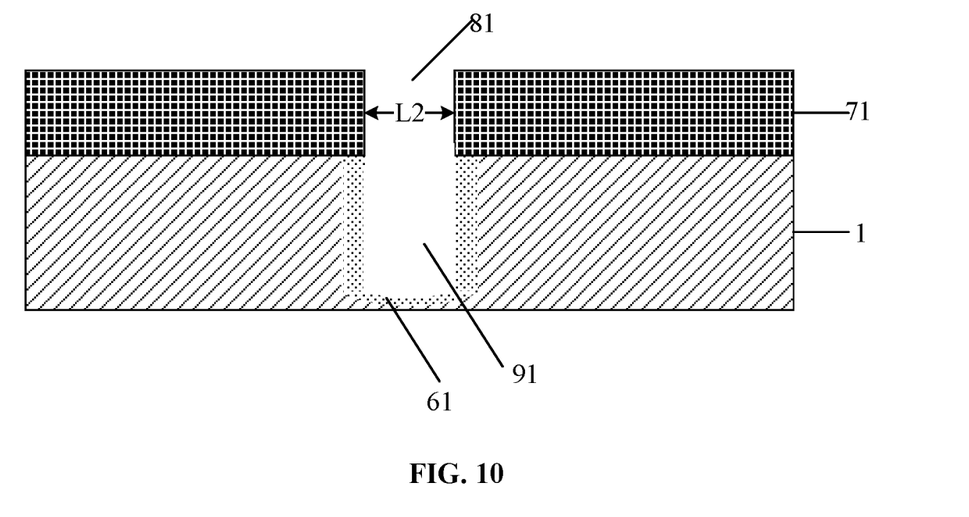
FIG. 10 illustrates a sixth schematic diagram of a method of manufacturing a buried word line structure according to an example of the disclosure.

As shown in FIG. 10, the part of the insulation region 6 corresponding to the second opening 81 is etched to form a word line trench 91 in the insulation region 6. The height of the word line trench 91 is less than the height H of the insulation region 6, so that damage to the semiconductor substrate 1 can be avoided, thus the generation of a leakage current can be prevented. In FIG. 10, a residual part of the etched insulation region 6 can be used as a gate oxide layer 61 of the buried word line structure. A thickness of the gate oxide layer 61 herein may be 3 to 8 nm and can be adjusted according to an actual need. The disclosure is not limited thereto, as long as the thickness of the residual insulation region 6 after etching can meet the requirement of a gate oxide layer of the buried word line structure.

Figure 11:
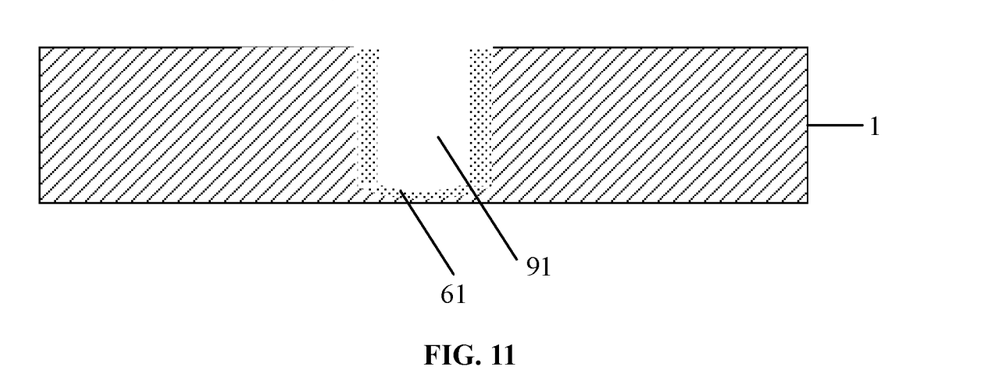
FIG. 11 illustrates a seventh schematic diagram of a method of manufacturing a buried word line structure according to an example of the disclosure.

As shown in FIG. 11, the second mask layer 71 can be removed.

Figure 12:
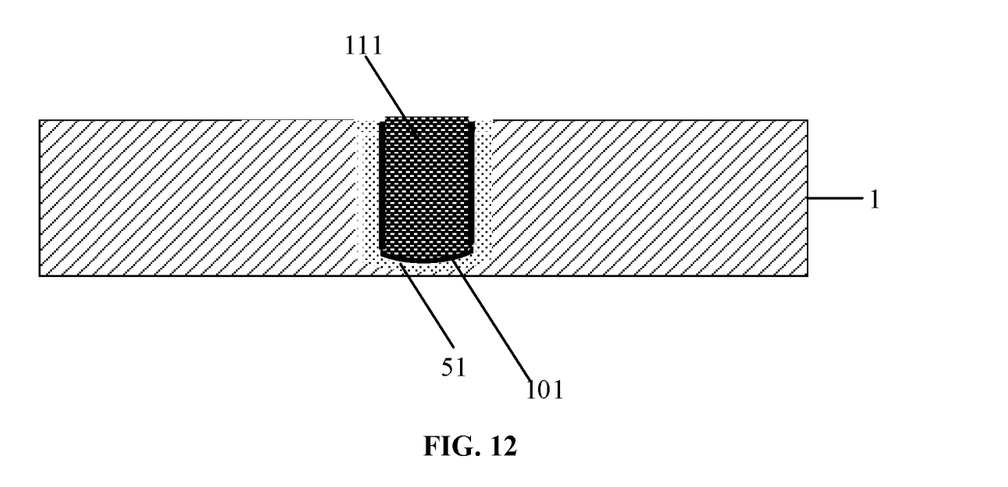
FIG. 12 illustrates an eighth schematic diagram of a method of manufacturing a buried word line structure according to an example of the disclosure.

As shown in FIG. 12, the word line trench can be filled with a word line metal 111 to form the buried word line structure.

In the examples of the disclosure, the word line trench has a bottom wall and a side wall which are connected with each other.

Optionally, before the word line trench is filled with the word line metal 111, a layer of metal barrier layer 101 is formed on the side wall and the bottom wall of the word line trench. The metal barrier layer 101 may use, for example, titanium nitride, conductive polycrystalline silicon, or other materials.

According to the method of manufacturing the buried word line structure provided by the implementation modes of the disclosure, the insulation region in the buried word line structure is formed by means of ion injection, and the insulation region is directly used as the gate dielectric layer of the buried word line structure. Compared with other methods, on the one hand, various embodiments of the disclosure will not damage the silicon surface of the semiconductor substrate, so that the generation of the leakage current is avoided, and the reliability of the semiconductor memory is improved; and on the other hand, the manufacturing process of one layer of gate dielectric layer is canceled, which simplifies the manufacturing process of the buried word line structure and reduces the cost.

FIG. 13 to FIG. 16 schematically illustrate diagrams of a method of manufacturing a buried word line structure according to an example of the disclosure.

Other manufacturing operations in the examples of the disclosure can refer to the above descriptions of FIG. 5 to FIG. 8. As shown in FIG. 13, a second mask layer 72 is formed on the upper surface of the semiconductor substrate 1. The second mask layer 72 has a second opening 82. The size of the second opening 82 is assumed to be L3, and L3 is less than the size L1 of the first opening 3 in the above example, so that the upper surface of the insulation region 6 is partially exposed through the second opening 82.

The size L3 of the second opening 82 in the example of FIG. 13 is greater than the size L2 of the second opening 81 in the example of FIG. 9, that is, compared with the example shown with FIG. 9, the example shown with FIG. 13 can expose more area of the upper surface of the insulation region 6.

Figure 14:
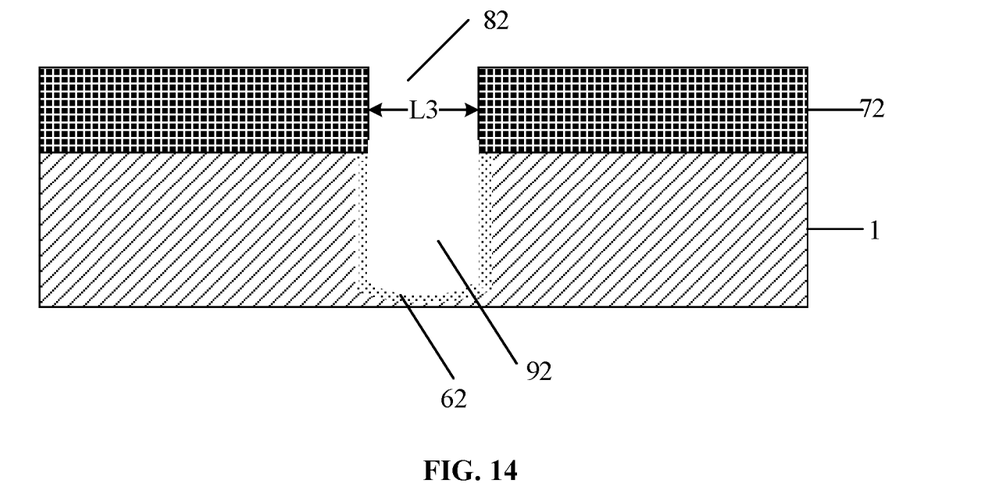
FIG. 14 illustrates a second schematic diagram of another method of manufacturing a buried word line structure according to an example of the disclosure.

As shown in FIG. 14, the part of the insulation region 6 corresponding to the second opening 82 is etched to form a word line trench 92 in the insulation region 6. A height of the word line trench 92 is less than a height H of the insulation region 6, so that damage to the semiconductor substrate 1 can be avoided, thus the generation of a leakage current is prevented. In FIG. 14, a residual part of the etched insulation region 6 can be used as a gate oxide layer 62 of the buried word line structure. A thickness of the gate oxide layer 62 here can be less than a thickness of the gate oxide layer 61 in the example of FIG. 10.

Correspondingly, since L3 is greater than L2, the width of the word line trench 92 formed in the example of FIG. 14 is greater than the width of the word line trench 91 in the example of FIG. 10.

Figure 15:
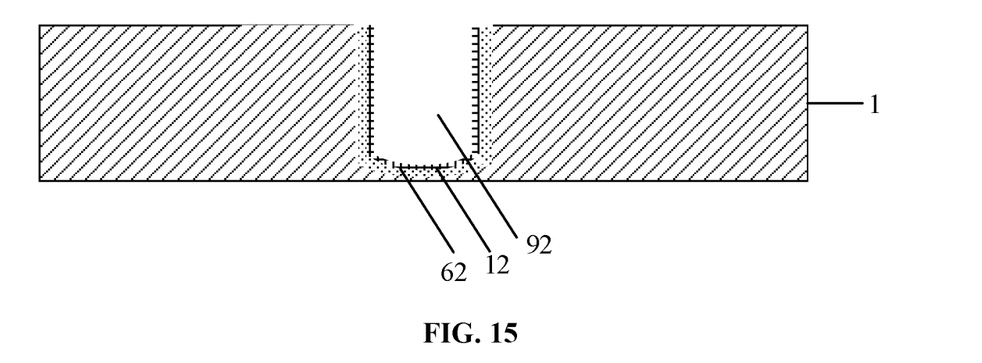
FIG. 15 illustrates a third schematic diagram of another method of manufacturing a buried word line structure according to an example of the disclosure.

As shown in FIG. 15, a second mask layer 72 may be removed, and one layer of gate dielectric layer 12 is additionally deposited on the side wall and the bottom wall of the word line trench 92. The gate dielectric layer 12 covers the surface of the gate oxide layer 62. The gate dielectric layer 12 can repair the gate oxide layer 62, so that the surface of the gate oxide layer 62 is smoother. Formation of the gate dielectric layer 12 does not damage the semiconductor substrate 1, either. A material of the gate dielectric layer 12 may be, for example, silicon oxide, but the disclosure is not limited to this.

Figure 16:
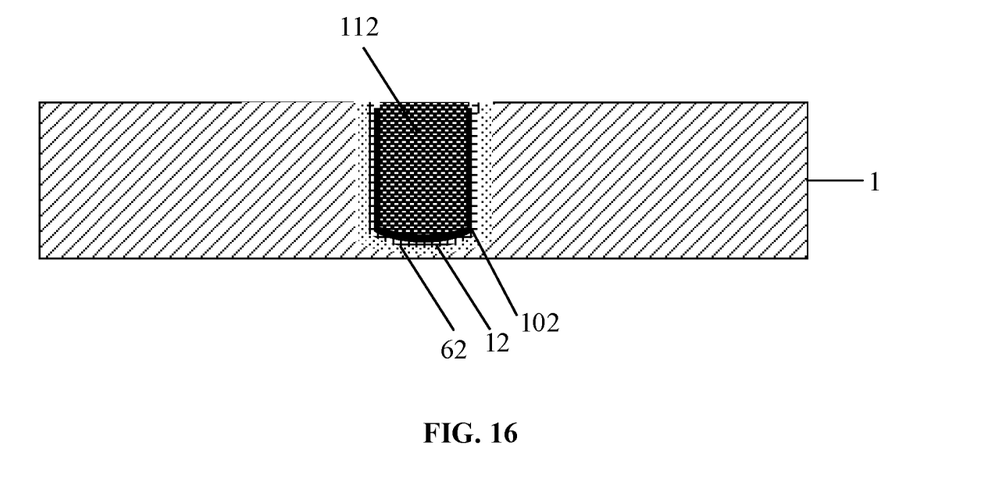
FIG. 16 illustrates a fourth schematic diagram of another method of manufacturing a buried word line structure according to an example of the disclosure.

As shown in FIG. 16, the word line trench 92 may be filled with a word line metal 112 to form a buried word line structure.

Optionally, before filling the word line metal 112, one layer of metal barrier layer 102 is formed on the gate dielectric layer 12.

In the examples of the disclosure, a columnar word line trench having a slightly arched bottom wall may be formed, so that the word line metal that is capable of filling the word line trench automatically forms a columnar word line having a slightly arched bottom wall, which ensures the consistency of both shapes of the columnar word line trench and the buried word line structure.

In the examples of the disclosure, a laser annealing can be employed to realize a fast annealing, so that the injected region injected with the target ions can be kept in the column shape having the slightly arched bottom wall to finally form the word line structure having the same shape as the gate.

According to the method of manufacturing the buried word line structure provided by the implementation modes of the disclosure, the insulation region in the buried word line structure is formed by means of ion injection, and the insulation region is directly used as the gate dielectric layer of the buried word line structure. Compared with the related technology, the disclosure will not damage the silicon surface of the semiconductor substrate, so that the generation of the leakage current is avoided, and the reliability of the semiconductor memory is improved Further, the examples of the disclosure provide a semiconductor memory. The semiconductor memory may include a buried word line structure manufactured by the method of any one of the above examples.

In the examples of the disclosure, the semiconductor memory may be any semiconductor memory, such as a dynamic random access memory (DRAM), but the disclosure is not limited thereto. The semiconductor memory may be any memory.

The semiconductor memory provided by the examples of the disclosure includes the above-mentioned buried word line structure, thus it has the same or similar advantages as or to the above-mentioned buried word line structure.

According to the method of manufacturing a buried word line structure and the semiconductor memory thereof provided by some examples of the disclosure, on one hand, in the process of manufacturing the buried word line structure, the word line trench is formed by means of ion injection, i.e., the target ions are injected into the semiconductor substrate to form the injected region in the semiconductor substrate, the semiconductor substrate including the injected region is annealed to convert the injected region into the insulation region, and the word line trench is formed in the insulation region, so that damage to the semiconductor substrate can be avoided; and on the other hand, the word line trench can be directly filled with the word line metal, so that the step of forming a gate dielectric layer can be omitted, which simplifies the process of manufacturing the buried word line structure. Moreover, when such buried word line structure is applied to manufacture a semiconductor memory, generation of leakage current in the semiconductor memory can be avoided, so that the performance of the semiconductor memory can be improved.

Those skilled in the art will easily think of other implementation solutions of the disclosure after considering the specification and practicing the invention disclosed here. The present application is intended to cover any variations, utilities, or adaptive changes of the disclosure. These variations, utilities, or adaptive changes follow the general principles of the disclosure and include common general knowledge or conventional technical means in the technical field, which are not disclosed herein. The specification and the examples are considered as being exemplary only, with a true scope and spirit of the disclosure being indicated by the following claims.

What is claimed is:

1. A method of manufacturing a buried word line structure, comprising:
    providing a semiconductor substrate;
    injecting target ions into the semiconductor substrate to form an injected region in the semiconductor substrate;
    annealing the semiconductor substrate comprising the injected region to convert the injected region into an insulation region;
    forming a word line trench in the insulation region by partially etching the insulation region, a width of the word line trench being less than a width of the insulation region, a height of the word line trench being less than a height of the injected region, and a residual part of the etched insulation region being used as a gate oxide layer of the buried word line structure; and
    filling the word line trench with a word line metal to form the buried word line structure.

2. The method of manufacturing the buried word line structure of claim 1, further comprising: before injecting target ions into the semiconductor substrate,
    forming a first mask layer on an upper surface of the semiconductor substrate, wherein the first mask layer comprises a first opening configured to partially expose the upper surface of the semiconductor substrate.

3. The method of manufacturing the buried word line structure of claim 2, further comprising: before forming the word line trench in the insulation region,
    forming a second mask layer on the upper surface of the semiconductor substrate, wherein the second mask layer comprises a second opening configured to partially expose the upper surface of the insulation region, and the second opening is smaller than the first opening.

4. The method of manufacturing the buried word line structure of claim 1, further comprising: before filling the word line trenches with the word line metal,
    additionally depositing a gate dielectric layer on a bottom and a side wall of the word line trench.

5. The method of manufacturing the buried word line structure of claim 1, wherein the target ions comprise oxygen-containing ions.

6. The method of manufacturing the buried word line structure of claim 1, wherein a concentration of the injected target ions is between 1E16 and 5E16 cm-2.

7. The method of manufacturing the buried word line structure of claim 1, wherein the target ions are injected with energy of 50 to 1000 KeV.

8. The method of manufacturing the buried word line structure of claim 1, wherein an injection depth of the target ions is 30 nm to 300 nm.

9. The method of manufacturing the buried word line structure of claim 1, wherein an annealing temperature is between 850° C. and 1300° C., and an annealing time is between 5 seconds and 60 seconds.

10. A semiconductor memory, comprising the buried word line structure manufactured by the method according to claim 1.

11. The method of manufacturing the buried word line structure of claim 1, further comprising, before filling the word line trench with the word line metal:
    forming a metal barrier layer on a side wall and a bottom wall of the word line trench.

12. A semiconductor memory, comprising the buried word line structure manufactured by the method according to claim 2.

13. A semiconductor memory, comprising the buried word line structure manufactured by the method according to claim 3.

14. A semiconductor memory, comprising the buried word line structure manufactured by the method according to claim 4.

15. A semiconductor memory, comprising the buried word line structure manufactured by the method according to claim 5.

16. A semiconductor memory, comprising the buried word line structure manufactured by the method according to claim 6.

17. A semiconductor memory, comprising the buried word line structure manufactured by the method according to claim 7.

18. A semiconductor memory, comprising the buried word line structure manufactured by the method according to claim 8.

19. A semiconductor memory, comprising the buried word line structure manufactured by the method according to claim 9.

* * * * *